United States Patent [19]

Tressler et al.

[11] Patent Number: 4,518,349
[45] Date of Patent: May 21, 1985

[54] CANTILEVERED BOAT-FREE SEMICONDUCTOR WAFER HANDLING SYSTEM

[75] Inventors: Richard E. Tressler, Julian; Joseph Stach; Roger L. Baeten, both of State College, all of Pa.

[73] Assignee: Better Semiconductor Processes (BSP), State College, Pa.

[21] Appl. No.: 557,232

[22] Filed: Dec. 1, 1983

[51] Int. Cl.³ .......................... F27D 3/00; F27D 5/00; F27B 9/04; F27B 9/14

[52] U.S. Cl. ...................................... 432/11; 432/23; 432/123; 432/239; 432/258

[58] Field of Search ............... 432/11, 23, 123, 208, 432/239, 258; 414/150

[56] References Cited

U.S. PATENT DOCUMENTS

| | | | |
|---|---|---|---|
| 3,183,130 | 5/1965 | Reynolds et al. | 148/188 |
| 3,604,694 | 9/1971 | Muller | 263/47 |
| 3,735,965 | 5/1973 | Way | 34/227 |
| 3,819,067 | 6/1974 | Hammond | 214/26 |
| 3,923,342 | 12/1975 | Shannon | 302/2 R |
| 3,951,587 | 4/1976 | Alliegro et al. | 432/253 |
| 4,075,972 | 2/1978 | Yamawaki et al. | 118/6 |
| 4,153,164 | 5/1979 | Hofmeister et al. | 211/41 |
| 4,218,214 | 8/1980 | Nelson | 432/258 |
| 4,439,146 | 3/1984 | Sugita | 432/239 |
| 4,459,104 | 7/1984 | Wollmann | 432/123 |

OTHER PUBLICATIONS

Solid State Technology; "New from ACS Non-Contact Cantilever Loader"; p. 39, Oct., 1982, Semiconductor International.
Semiconductor International; "A Suspended Boat Loader Based on the Cantilever Principle" by J. L. Lambert et al., pp. 150–155; Apr., 1983.

Primary Examiner—John J. Camby
Attorney, Agent, or Firm—Michael L. Dunn; Howard M. Ellis

[57] ABSTRACT

An improved semiconductor wafer handling system completely eliminates the need for boats, sleds, paddles, wheeled carriers, etc., customarily employed in transporting wafers during heat processing through the use of a plurality of rigid, polished cantilevered rods having a multiplicity of spaced slots for cooperatively holding wafers in an upright position. The system provides a means for achieving higher production yields of such semiconductor elements by generating fewer contaminating particles and through less exposure to ambient environment.

24 Claims, 6 Drawing Figures

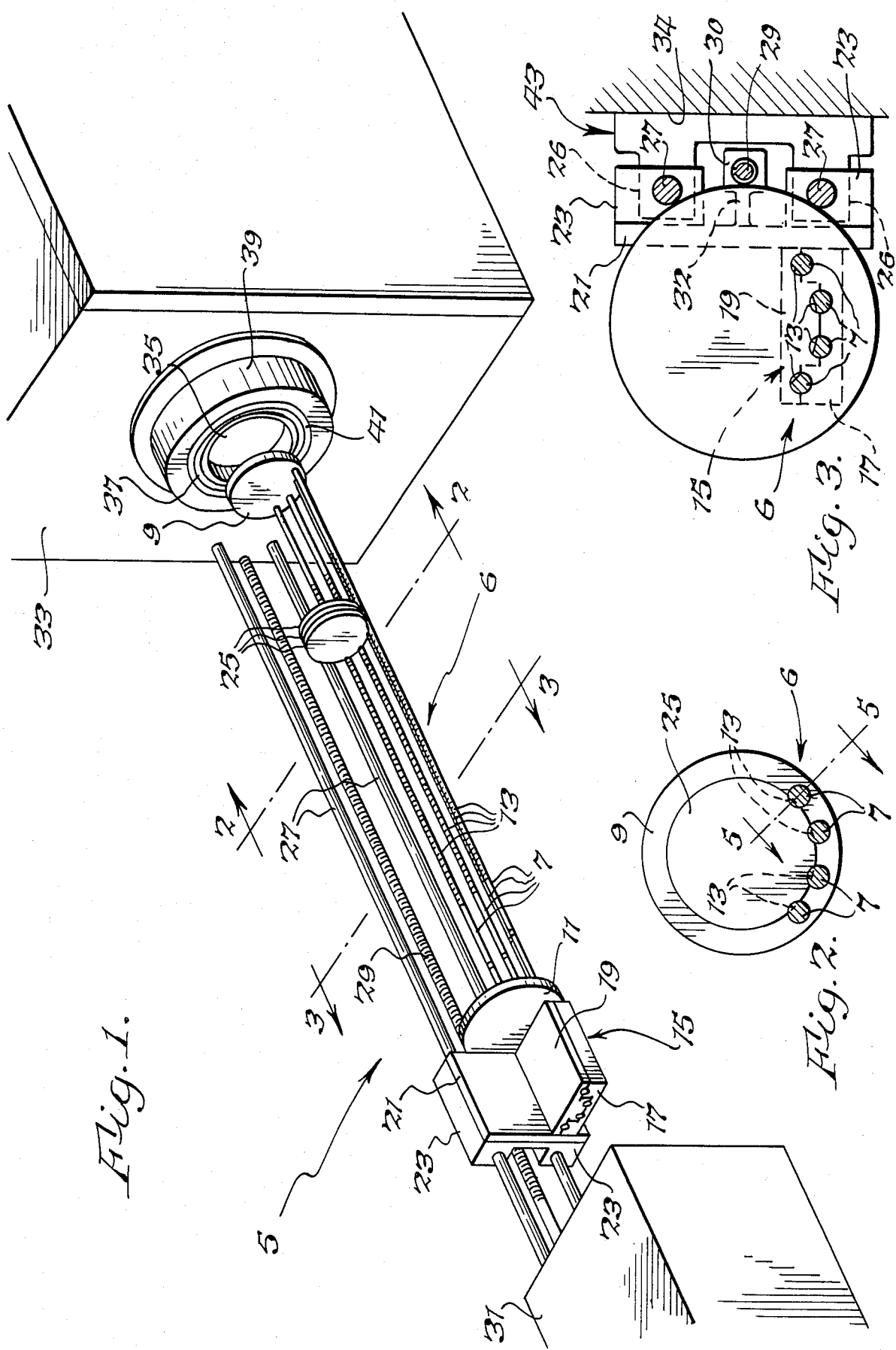

CANTILEVERED BOAT-FREE SEMICONDUCTOR WAFER HANDLING SYSTEM

BACKGROUND OF THE INVENTION

This invention generally relates to means for making semiconductor elements, and more particularly, to an improved process and apparatus which will provide higher yields of semiconductor wafers.

Semiconductor elements have a wide range of applications in the electronics industry. They are used, for example, in rectifiers, transistors, diodes, solar batteries, integrated circuits and the like. The term—semiconductor element—is generally accepted throughout the industry and is intended herein to generically include semiconductor devices and parts thereof formed of host-substrates comprising elements, alloys and intermetallic compounds of silicon, germanium, silicon/germanium, etc. Such semiconductor elements can be of any convenient or suitable shape or form, but are typically used in the form of circular wafers or disks. For purposes of the present invention semiconductor elements will hereinafter be referred to as—wafers.

To impart the needed electrical rectification properties, wafers have active impurities or conductivity modifiers incorporated within the host substrate by high temperature diffusion of vaporized dopant atoms. The doping process involves placing wafers into high temperature processing furnaces equipped with relatively long cylindrically shaped quartz lined heat treating chambers or process tubes where the conductivity modifiers are diffused into the wafers through selectively-defined openings in masks formed adjacent to wafer surfaces. Other high temperature semiconductor device fabrication processes are performed in furnace process tubes including chemical vapor deposition, oxidation, annealing and cleaning, to name but a few.

In manufacturing processes it is especially important to avoid contaminating the semiconductor wafers with undesirable dust-like impurities in order to maximize product yield with the desired electrical properties. As part of the manufacturing process, wafers are customarily placed on transporting "boats" usually consisting of quartz sleds plus paddles which may also include various types of wheeled carriers, trucks, positioning racks, etc. Such boats are used to hold wafers in process tubes during firing operations and are part of the loading system.

The transporting and handling of wafer boats by operators increases the risk of exposure of wafers to undesirable impurities and physical damage, resulting in reduced yields. The process of loading and unloading boat carriers, for example, necessitates moving the boats to a separate transfer station where the wafers are transferred from cassettes to boats which are then transported to the furnace area where they are then placed on the furnace loader for thermal treatment e.g. doping. Subsequently, the boats are returned to the transfer station where the wafers are returned to their cassettes for further processing. Thus, use of wafer boats leads to further contamination outside the furnace through greater exposure to dust, particle pick-up and risk of damage through increased handling.

Wafer boats also generate undesirable contaminants inside furnace processing tubes. Boats per se are a source of undesirable contaminating impurities because they undergo devitrification during thermal cycling and exposure to various furnace ambients. In addition, during push/pull cycles, loading systems deliver and remove wafer loaded boats to and from process tubes. Because of process tube diameter limitations the use of wafer boats creates close tolerances with tube side walls. Consequently, boats and their transport during the push/pull loading and unloading cycles not only generate abrasion dust and particle pick-up, but also shortens process tube life expectancy due to premature groove formation and crystallization of fused quartz.

Efforts by others to reduce particulate contamination through improved wafer handling methods and systems have not been totally satisfactory. For example, one wafer handling system employs dual cantilevered aluminum oxide or silicon carbide ceramic rods sleeved with fused quartz tubes. Although this handling system apparently reduces some unwanted particulates by avoiding contact with process tube side-walls, the system calls for mounting wafers onto boat carriers which serve as a source of potential contamination both outside and inside the furnace. Furthermore, aluminum oxide rods tend to degrade after several thermal cycles, exhibit poor thermal shock characteristics and have a tendency to permanently sag or deflect. Should aluminum oxide rods make contact with fused quartz they can react and undergo mechanical degradation. This system is described in Semiconductor International, pages 150–155, April 1983.

U.S. Pat. No. 3,923,342 discloses an automated wafer conveying device which relies on so-called "air slides" for loading wafer boats. The boat is formed of four slotted quartz rods which collectively support multiple wafers in an upright vertical position. The rods forming the boats are not supported in cantilevered fashion, but instead are linked together as wafer carriers by means of "end quartz rods".

U.S. Pat. No. 3,951,587 suggests high purity sintered silicon carbide made impervious to gases by impregnation with high purity silicon. Their diffusion furnace parts, including the process tube or liner or both are fabricated from silicon/silicon carbide. However, the patentees also suggest instead of eliminating boats and other types of kiln "furniture" that they too be fabricated from silicon/silicon carbide.

U.S. Pat. No. 3,604,694 suggest heat treatment of silicon disks for doping in a horizontal quartz tube which serves as a disk support. Multiple silicon rods line the quartz tube preventing the disks from making contact with the tube. The support rods, however, make contact with the interior walls of the quartz tube. Frictional contact between the rods and quartz tube can serve as a source of unwanted particulate contamination. Accordingly, there is a need for an improved method and system for handling and delivering semiconductor wafers which will provide a lower level of particulates directly and indirectly attributed to the use of paddles, wheeled carriers and other types of wafer boat carriers.

The present invention relates to a system comprising an improved process and apparatus for reducing the level of undesired contaminating impurities generated during the high temperature thermal processing of semiconductor wafers. The improved high temperature equipment and materials of construction used in this system eliminates the need for sleds, paddles, wheel carriers, trucks, separate positioning racks, holders and other types of boat fixtures ordinarily used in thermal processing of semiconductor wafers. The improved system includes diffusion furnaces and other high temperature semiconductor processing equipment fitted or retro-fitted with polished, high density, high purity, spaced ceramic rods suspended in cantilevered fashion. The cantilevered rods eliminate or minimize surface and frictional contact with furnace process tubes during the push/pull cycles of the process reducing unwanted frictional particulates. Because the rods are slotted and spaced from one another so as to support a multiplicity of wafers in adjacent, vertical position the need for boat carriers and additional handling steps at separate transfer stations customarily required with previous systems, can be eliminated. That is to say, the cantilevered-boat free carrier system of the present invention permits direct loading and unloading of wafers to and from covered storage cassettes at the furance eliminating undesirable additional handling steps by operators and exposure of the wafers to ambient conditions outside the furnace. Thus, the present invention provides a means for achieving higher production yields of useful semiconductor wafers.

In addition to the foregoing, the improved boat-free wafer processing system utilizes polished, strong, high temperature, high purity, creep resistant siliconized-silicon carbide as the preferred material of construction with a longer useful life expectancy which avoids the shortcomings associated with systems based on aluminum oxide or silicon carbide or other refractory materials sheathed with fused quartz.

Thus, it is one principal object of the present invention to provide an improved high yield delivery and handling system for semiconductor wafers.

It is a further principal object of the present invention to provide a process for reducing and in some instances substantially eliminating sources of contamination and risk of damage to semiconductor wafers during high temperature thermal processing operations originating mainly from boat carriers, loading systems, furnace tubes, and through handling by operators.

An additional object is to provide a novel boat-free wafer handling apparatus which is also adaptable for retrofitting to existing diffusion furnaces.

A still further object of the present invention is to provide materials of construction which enable the use of cantilevered construction for direct receipt and support of wafers for thermal processing.

These and other objects, features and advantages of the present invention will become more apparent from the following more detailed descriptions.

SUMMARY OF THE INVENTION

The present invention relates to novel apparatus and methods for making semiconductor wafers wherein thermal processing steps are utilized, such as in doping operations, oxidation, chemical vapor deposition (CVD), low pressure CVD, plasma enhanced CVD, as well as in annealing, cleaning etc. The process is carried out by means of a furnace having one or more tubular shaped, fused quartz heat treating chambers or process tubes traversed by wafer carrier means. The level of unwanted contaminating impurities generated during the process is reduced by mounting the wafers directly onto the carrier which comprises a plurality of semicircular spaced cantilevered rods having a multiplicity of spaced slots for cooperatively holding individual semiconductor wafers and doping elements in a vertical position. The carrier, which is supported at the cold end of the furnace, includes a hot-end plate affixed to the rear or opposing end of the carrier means from which the rods are supported. Preferably, a cold end plate is affixed to the frontal end of the cantilevered rods proximate to the suspending means for sealing the process tube upon insertion of the carrier.

Contact with the inside cylindrical surface of the process tube is avoided during loading and unloading when the wafer filled carrier system is inserted into the tube during the push cycle and withdrawn during the pull cycle. The slotted rods have sufficient strength and rigidity, including other desirable physical, as well as chemical properties to withstand high furnace temperatures, corrosive ambients and stresses concomitant with cantilevered construction. Because the cantilevered carrier system supplants the need for carrier boats space tolerances in the process tube are less critical, permitting greater use of available tube volume for wafer processing and for possible negligible deflection of the rods when fully loaded. The rods are comprised of high purity polycrystalline silicon-based ceramics, including silicon-silicon carbide ceramics, sintered silicon, etc. which are capable of withstanding the corrosive environment during thermal processing.

The wafer handling system also includes means for mounting the wafer carrier for inserting and withdrawing a loaded carrier without making contact with the process tube sidewalls. The system may also be retrofitted to existing diffusion furnaces and is fully compatible with automated/robotized wafer transfer systems.

BRIEF DESCRIPTION OF THE DRAWINGS

For a further understanding of the invention, as well as the characterizing features, reference should now be made to the following detailed description thereof taken in conjunction with the accompanying drawings wherein:

FIG. 1 is a perspective view of the cantilevered boat-free wafer handling system before insertion into a diffusion furnace.

FIG. 2 is a sectional view taken along line 2—2 of FIG. 1, facing the hot end plate.

FIG. 3 is a sectional taken along line 3—3 of FIG. 1, facing the cold end plate and rod support.

DESCRIPTION OF PREFERRED EMBODIMENTS

Turning now to FIG. 1, there is illustrated the boat-free wafer handling/delivery system 5 of the present invention comprising a rod assembly 6; a drive mechanism 31 and a diffusion furnace 33. For purposes herein the expression "boat-free" is intended to refer to semiconductor wafer handling systems without the customary fixtures used to hold wafers during thermal processing operations, said fixtures usually consisting of quartz sleds and paddles, wheel carriers, trucks, positioning racks, and the like. Instead, the wafers are directly mounted to the rod assembly without the usual intermediate carriers.

Figure 6:
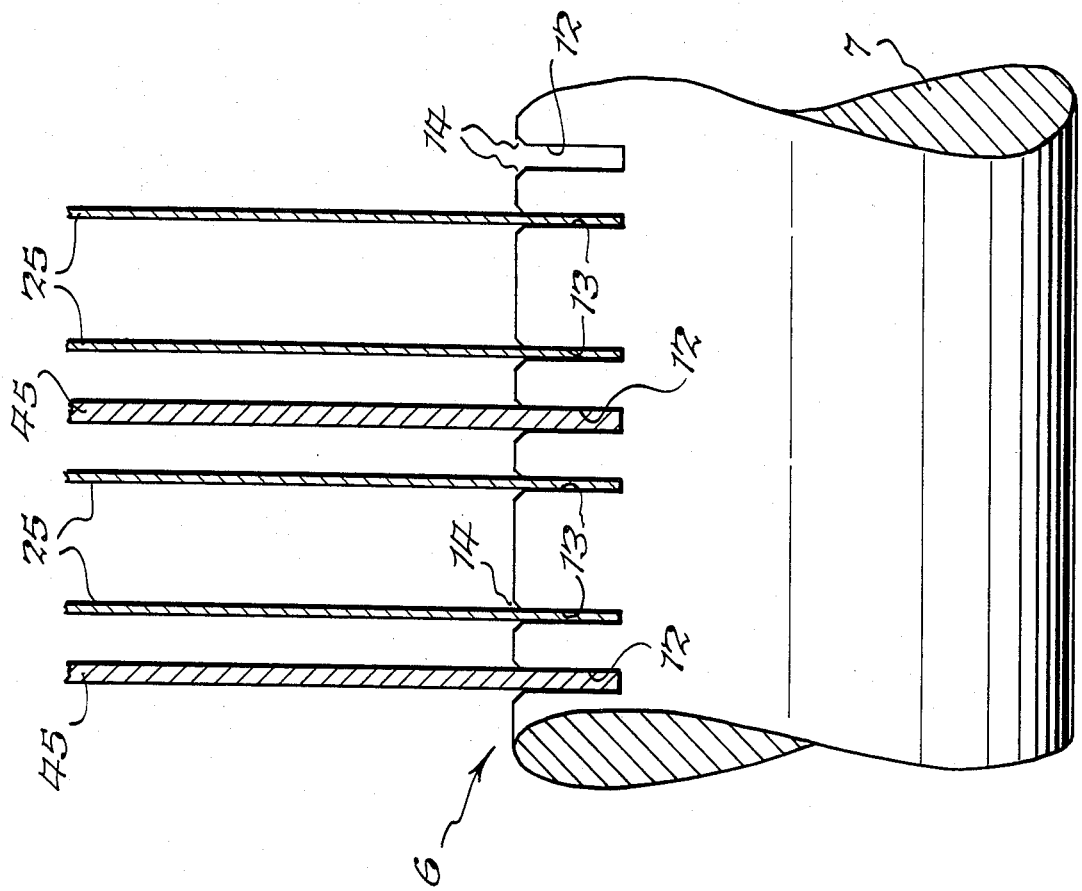
FIG. 6 is an enlarged sectional view of a slotted cantilevered rod having both wafers and source elements.
Figure 5:
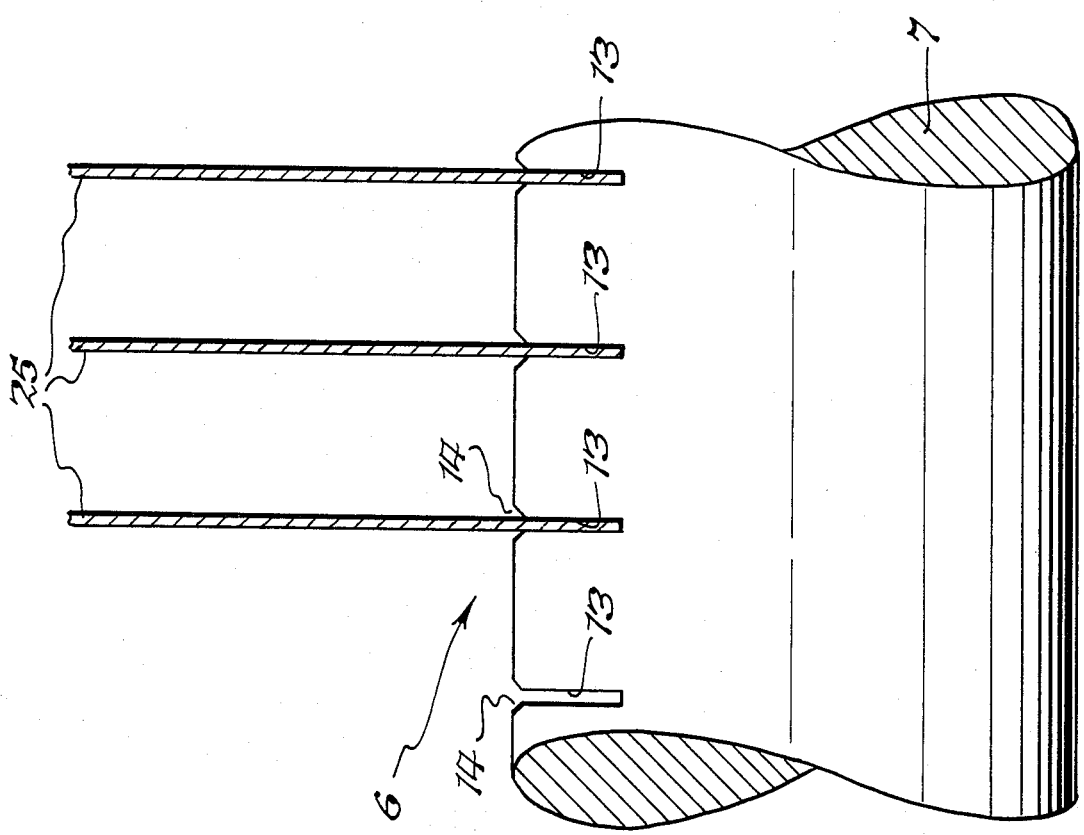
FIG. 5 is an enlarged sectional view of a slotted cantilevered rod with wafers only taken along 5—5 of FIG. 2.

The principal element of the boat-free wafer handling/delivery system is the rod assembly 6 which is comprised of a plurality of parallel, spaced cantilevered rods 7. At least two, and more specifically, 2 to about 6 cantilevered rods 7 are spaced parallel to each other and arranged in a semi-circular configuration. FIG. 2 best illustrates the ends of four of such rods positioned at the lower periphery directly and cooperatively supporting a multiplicity of wafers 25 in spaced slots 13. The slots are best illustrated in FIGS. 5 and 6.

The slotted cantilevered rods 7 may be of any convenient dimension e.g. 2 to 6 feet or otherwise of sufficient length to traverse the cold zone 40 and hot zone 38 of the process tube 35 of the furnace. The slotted rods 7 are suspended at the "cold" zone 40 (FIG. 4) of the furnace in cantilevered manner by means of a rod clamp 15 consisting of a lower clamping member 17 and an upper clamping member 19. The upper and lower clamping members lock the rods 7 in a stationary position by means of fasteners of conventional design (not shown).

Figure 4:
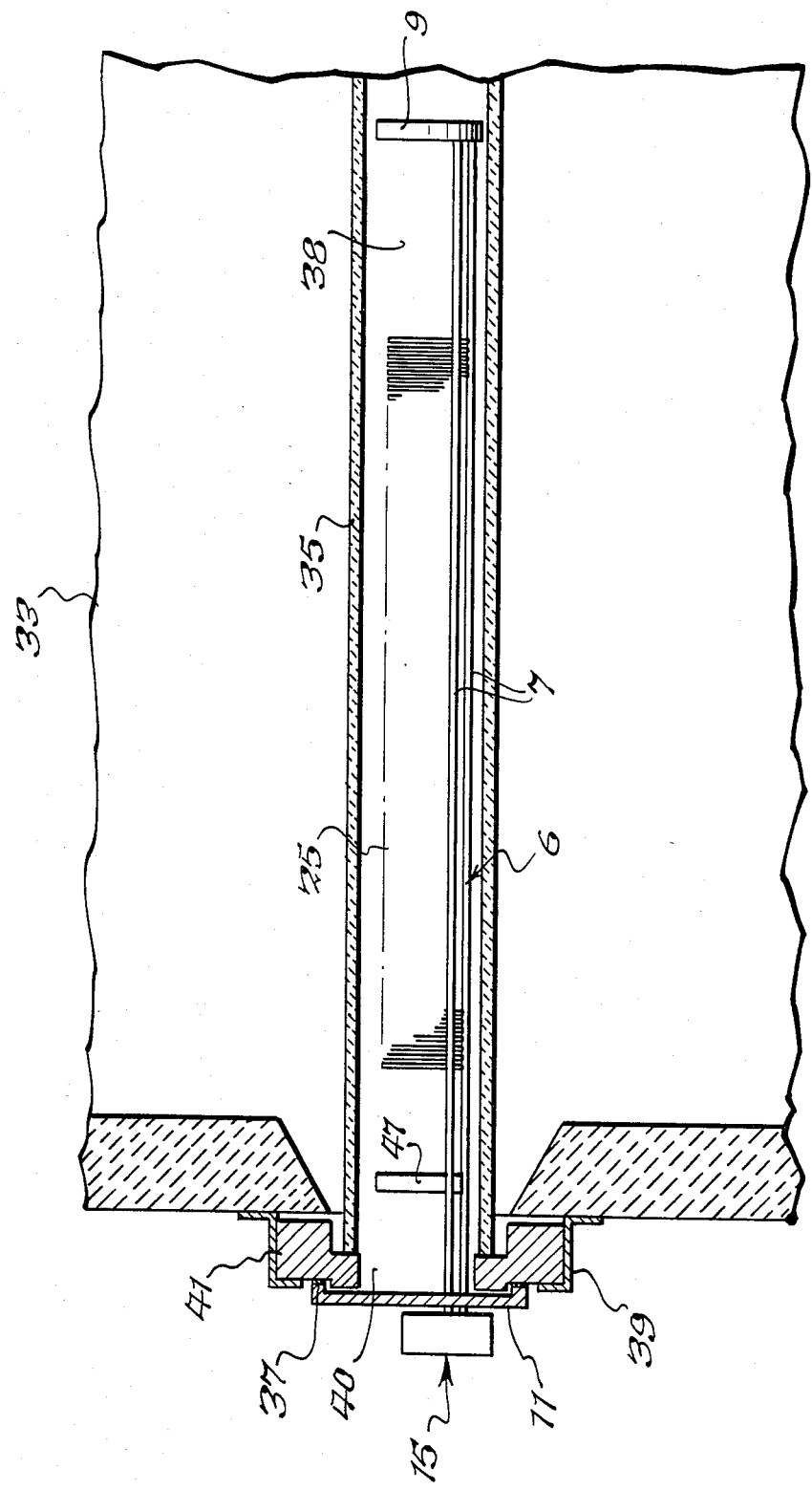
FIG. 4 is a side view of the boat-free cantilevered carrier inserted in the process tube of the furnace.

The rod assembly 6 also includes a rearwardly positioned hot-end plate 9 (FIG. 2) mounted perpendicular to the slotted rods 7 and stationed near the terminal end of said rods. The hot end plate 9 functions as a baffle in the hot zone 38 of the process tube. When the wafer carrier is inserted in the process tube of diffusion furnace 33 as shown in FIG. 4, hot end plate 9 acts as a gas flow diffuser whereas the cold end plate 11 controls backstreaming and the potential inward flow of unwanted contaminants from entering the process tube. The hot end plate also reduces backstreaming of gases into the heat treating chamber during unload position. The hot end plate 9 also aids in maintaining the suspended rods so they remain uniformly parallel and rigid enhancing their resistance to deflect. The hot end plate is preferably fabricated from a high purity siliconized silicon carbide ceramic or other high purity polysilicon based ceramic material, in order to sustain the high temperatures of the furnace hot zone. As in the case of the slotted rods 7, the hot end plate avoids contact, frictional or otherwise, with interior walls of the hot zone of the process chamber 35 during either the push or pull cycles thereby minimizing contamination of the system by dust and particle generation.

Although not required in all instances, the wafer carrier 6 preferably includes a frontal cold end plate 11 (FIG. 3) affixed to rods 7. The cold end plate 11 which is in close proximity to the rod clamp 15 functions as a process tube seal during thermal operations. Plate 11 seals the process tube 35 by compression against sealing ring 41 at the mouth of the process tube. Ring 41 is retained in position by means of a clamp 39. A gasket 37 fabricated from silicone rubber or other suitable material is seated on ring 41 providing an air tight closure when the furnace is loaded with wafers for thermal treatment. The cold end plate minimizes backstreaming or loss of exhaust gases. Plate 11 may be fabricated, for example, from siliconized silicon carbide or other suitable silicon based ceramic material. Alternatively, the cold end plate may be fabricated from various metals and alloys, such as stainless steel. The sealing edges of the cold end plate are preferably diamond polished to further reduce the possibility of backstreaming of exhaust gases.

As an optional element rod assembly 6 may include a condensation plate 47 (FIG. 4) affixed to the cantilevered rods 7 in an upright vertical position. It is supported vertically by means of multiple slots in rods 7 which cooperatively cradle the plate enabling easy installation and removal for cleaning etc. The condensation plate 47 is located closest to the cold end plate of the carrier such that during the push cycle it is stationed in the cold end zone 40 of the process tube 35. The condensation plate may be fabricated, for example, from siliconized silicon carbide, polysilicon or other suitable material into a disk-like structure of approximately the same diameter of the hot end plate. Plate 47 operates to reduce the condensation which normally develops on the cold end plate. By condensing gases on the condensation plate the need to clean the cold end plate is reduced or eliminated which has the effect of reducing maintenance and increasing productivity.

Rod assembly 6 is mounted for longitudinal movement in and retraction from the process tube 35 of diffusion furnace 33 by a motorized drive 31. The rod clamp 15 may, for example, be fastened by suitable means to a mounting plate 21. The backside of plate 21 may comprise multiple slide bearings 23 for accommodating support rods 27. The backside of plate 21 also includes a threaded lug 30 affixed to said plate by connector 32. Screw 29 is rotated by motorized drive 31 which engages with lug 30 advancing the wafer filled carrier into the process chamber or retracting the carrier therefrom by clockwise and counterclockwise movements. Support rods 27 are stationary mounted to connectors 26 of bracket 43 (FIG. 3) attached to mounting surface 34. The bearing and screw region of system 5 can be exhausted by conventional means and/or coated to minimize any particles generated as a result of motion.

As previously indicated, one main object is to provide a system of cantilevered rods 7 adapted to support semiconductor wafers during thermal processing operations without boat carriers. In order to achieve this objective, two or more of such rods are arranged in a stationary, semi-circular configuration cooperatively supporting the wafers on their edges in a substantially vertical or upright pattern. FIGS. 5 and 6 best illustrate semi-conductor wafers 25 held in slots 13 of rod 7. The outer surface edges of slots 13 are preferably beveled as shown at 14 for ease of insertion with minimal particle generation. FIG. 3 best illustrates an arrangement of four cantilevered rods 7 wherein each rod is indexed so that slots 13 are positioned at the most advantageous angle to securely seat the edges of the wafer to the bottom of each slot. Generally, the slots have a depth of approximately $\frac{1}{8}$ inch.

FIG. 5 illustrates wafers 25 seated in slots 13 of rod 7 wherein each wafer slot is evenly spaced from the other. This arrangement can be used, for example, when it is desired to react silicon wafers with a gas phase to oxidize the wafer to form either a silicon oxide, masking oxide or to form any other insulating or masking thin films thereon. This pattern of slots can also be used with gaseous dopants or to deposit other types of films, such as passivating films, conducting films or to anneal wafers in an inert environment. Typically, a semicircular arrangement of four cantilevered rods will each have slots to hold up the 200 wafers. The slots are positioned on each rod so that all wafers are treated in the hot zone of the furnace tube.

FIG. 6 provides an alternative arrangement of slotted cantilevered rods for use with solid dopants. Wider beveled slots 12 support source wafers 45 in an upright vertical position between two parallel semiconductor wafers 25 in narrower beveled slots 13. Deposition of active impurities, such as boron, phosphorus, arsenic, antimony, silicon, tellurium, tin, etc. onto the surface of wafers 25 occurs from the sources wafer 45 during high temperature diffusion of vaporized dopant atoms.

As previously indicated, the boatless cantilevered wafer carrier system generally utilizes a plurality of polished, high density, high purity, high temperature resistant, creep resistant rods fabricated from ceramic materials. Such ceramics should have sufficient low temperature strength to withstand the forces created by cantilevered suspension which means a high elastic modulus under load to avoid making contact with the walls of the process tube during the push cycle. They also should possess good resistance against creep at high temperatures. The rods must also have a low level of impurities and be devoid of dopants which can modify the characteristics of silicon wafers. Likewise the materials should be resistant to chemical attack in the process chamber. Examples of suitable ceramic materials are siliconized silicon carbide, sintered silicon carbide, silicon nitride or siliconized silicon nitride. The most preferred material of construction for the cantilevered rods is the siliconized silicon carbide polycrystalline ceramic having two phases. The high density and purity of siliconized silicon carbide make it especially adaptable for use in the present invention. The high density rods have excellent mechanical properties and their surfaces when polished reduce or eliminate possible holding of contaminants. The foregoing ceramic materials are known and available commodities of commerce.

EXAMPLE

A series of siliconized silicon carbide ceramic rods available from The Carborundum Company under the trademark Hexoloy KT were tested for mechanical properties under a simulated full load of 200 silicon wafers having a diameter of 100 mm. The rods were ⅜ inch diameter and 6 feet in length. Two rods were machined using the well-known centerless grinding technique and slotted to ⅛ inch in depth using a diamond saw. Dual rods were mounted onto a clamp (15) so they were in spaced and parallel relationship and at the opposite end of the rods a siliconized-silicon carbide hot end plate having mounting holes was inserted onto the rods. No cold end plate was utilized. The rods supported at one end by clamp 15 and loaded with 200 silicon wafers (100 mm in diameter) in the slots showed an elastic deflection at room temperature of only 1 mm at the furthest end from the point of suspension. The fully loaded boat-free cantilevered suspended rods were then inserted into a 1250° C. diffusion furnace tube for 200 hours. Deflection of the loaded cantilevered rods was measured inside the furnace by means of a cathetometer and found to have only 1 mm deflection. At the conclusion of the test the wafers were removed from the boat-free carrier rods and tested for permanent deflection due to plastic deformation. There was no evidence of permanent deformation of the rods. There was no evidence of degradation observed to the rods except formation of a blueish surface color due to the formation of an oxide.

Although the invention has been described in considerable detail with respect to the preferred embodiments thereof, it will be apparent that the invention is capable of numerous modifications and variations to those skilled in the art without departing from the spirit and scope of the invention, as defined in the claims.

What is claimed is:

1. In a process of heat treating semiconductor wafers in a high temperature furnace equipped with an internal heat treating chamber and carrier means adapted to support said wafers and traverse the heat treating chamber, the improvement comprising reducing the level of undesired contaminating particles generated during the process by mounting the wafers onto a boat-free wafer carrier, said carrier comprising a plurality of semi-circular spaced cantilevered rods or tubes having a multiplicity of spaced slots for cooperatively holding individual wafers in a vertical position.

2. The process of claim 1 wherein the carrier includes a rearwardly mounted hot end-plate and frontal cold end-plate each of said plates being mounted perpendicular to said cantilevered rods which are substantially parallel to each other.

3. The process of claim 2 wherein the cantilevered rods and hot end plate reduce the level of undesired contaminating particles by avoiding contact with the interior sidewalls of the heat treating chamber.

4. The process of claim 3 wherein the cold end plate includes means for sealing the heat treating chamber.

5. The process of claim 1 wherein the cantilevered rods are fabricated from a material selected from the group consisting of siliconized silicon carbide, sintered silicon carbide, silicon nitride and siliconized silicon nitride.

6. The process of claim 3 wherein the cantilevered rods are fabricated from siliconized silicon carbide.

7. The process of claim 5 wherein the cantilevered rods include spaced slots for cooperatively holding source wafers.

8. In a process of depositing active dopants on semiconductor wafers by means of high temperature diffusion employing a furnace equipped with an internal heat treating chamber and carrier means adapted to support said wafers and traverse the heat treating chamber, the improvement comprising reducing the level of undesired contaminating particles generated during the process by mounting the wafers onto a boat-free wafer carrier, said carrier comprising a plurality of semi-circular spaced cantilevered rods having a multiplicity of spaced slots for cooperatively holding individual wafers in a vertical position.

9. The process of claim 8 wherein the carrier includes a rearwardly mounted hot-end plate mounted perpendicular to said cantilevered rods which are substantially parallel to each other.

10. The process of claim 9 wherein the carrier includes a frontal cold end-plate with means for sealing the heat treating chamber.

11. The process of claim 9 wherein the cantilevered rods include spaced slots for cooperatively holding source wafers.

12. The process of claim 9 wherein the cantilevered rods are fabricated from a material selected from siliconized silicon carbide or sintered silicon carbide.

13. A boat-free semiconductor wafer handling apparatus comprising a plurality of semicircular spaced rods, means for holding the rods in cantilevered suspension, and a hot-end plate mounted proximal to the opposing ends of said rods maintaining the rods substantially parallel to each other, said rods having a multiplicity of spaced slots for cooperatively holding individual wafers in a vertical position.

14. The boat-free wafer handling apparatus of claim 13 including a frontal cold end-plate positioned between the holding means and hot end-plate, each of said plates being mounted perpendicular to said rods.

15. The boat-free wafer handling apparatus of claim 14 including a condensation plate mounted to the rods between the hot and cold end plates.

16. The boat-free wafer handling apparatus of claim 14 wherein the frontal cold end-plate and hot end-plate have openings on their peripheral edges for receiving the cantilevered rods.

17. The boat-free wafer handling apparatus of claim 16 wherein the rods include slots for cooperatively holding doping elements in a vertical position.

18. The boat-free wafer handling apparatus of claim 14 including means for longitudinally extending and retracting the same.

19. The boat-free wafer handling apparatus of claim 13 wherein the rods are fabricated from a material selected from the group consisting of siliconized silicon carbide, sintered silicon carbide, silicon nitride and siliconized silicon nitride.

20. An improved system for heat treating semiconductor wafers while reducing the level of undesired contaminating particles, which comprises a furnace equipped with at least one high temperature internal heat treating chamber, a boat-free wafer carrier adapted to hold the wafers without making contact with the interior sidewalls of said chamber during heating and while traversing the heat treating chamber, and means for inserting and retracting the carrier into and out of the heat treating chamber of the furnace, said wafer carrier comprising a plurality of semi-circular spaced cantilevered rods having a multiplicity of spaced slots for cooperatively holding individual wafers in a vertical position.

21. The system of claim 20 wherein the boat-free wafer carrier includes separate hot and cold end plates mounted on the cantilevered rods in spaced relationship.

22. The system of claim 21 wherein the cantilevered rods are fabricated from a material selected from the group consisting of siliconized silicon carbide, sintered silicon carbide, silicon nitride and siliconized silicon nitride.

23. The system of claim 21 wherein the diffusion furnace is retro-fitted with said boat-free wafer carrier means.

24. The system of claim 21 wherein the boat-free wafer carrier includes a condensation plate mounted on the rods between the hot and cold end plates.

* * * * *